United States Patent [19]
Bechtolsheim et al.

[11] Patent Number: 5,973,951
[45] Date of Patent: *Oct. 26, 1999

[54] SINGLE IN-LINE MEMORY MODULE

[75] Inventors: Andreas Bechtolsheim, Stanford; Edward Frank, Portola Valley; James Testa, Mountain View; Shawn Storm, Mt. View, all of Calif.

[73] Assignee: Sun Microsystems, Inc., Palo Alto, Calif.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/878,705

[22] Filed: Jun. 19, 1997

Related U.S. Application Data

[63] Continuation of application No. 08/643,094, May 2, 1996, abandoned, which is a continuation of application No. 08/473,073, Jun. 7, 1995, Pat. No. 5,532,954, which is a continuation of application No. 08/345,477, Nov. 28, 1994, Pat. No. 5,465,229, which is a continuation of application No. 08/279,824, Jul. 25, 1994, Pat. No. 5,383,148, which is a continuation of application No. 08/115,438, Sep. 1, 1993, abandoned, which is a continuation of application No. 07/886,413, May 19, 1992, Pat. No. 5,270,964.

[51] Int. Cl.⁶ ................................................... G11C 13/00
[52] U.S. Cl. ................................. 365/52; 365/51; 365/59; 365/63
[58] Field of Search ................................. 365/52, 51, 58, 365/63, 59

[56] References Cited

U.S. PATENT DOCUMENTS 3,161,859  12/1964  Medwin et al. ........................... 365/52
3,508,209   4/1970  Augusta et al. ........................... 365/51

(List continued on next page.)

FOREIGN PATENT DOCUMENTS

| | | |
|---|---|---|
| 0 188 828 A2 | 7/1986 | European Pat. Off. . |
| 0 246 025 B1 | 11/1987 | European Pat. Off. . |
| 0 287 274 A2 | 10/1988 | European Pat. Off. . |
| 0 394 935 A2 | 10/1990 | European Pat. Off. . |
| 0 398 188 A2 | 11/1990 | European Pat. Off. . |
| 0 434 543 A2 | 6/1991 | European Pat. Off. . |
| 0484062 A1 | 10/1991 | European Pat. Off. . |
| 0 476 685 A2 | 3/1992 | European Pat. Off. . |
| 0571092 A2 | 4/1993 | European Pat. Off. . |
| 59-144155 | 8/1984 | Japan . |
| 62-155546 | 7/1987 | Japan . |
| 63-197083 | 8/1988 | Japan . |
| 63-137957 | 9/1988 | Japan . |
| 1258466 | 10/1989 | Japan . |
| 1305562 | 12/1989 | Japan . |
| 02310644 | 12/1990 | Japan . |
| 3248896 | 11/1991 | Japan . |
| 3262055 | 11/1991 | Japan . |
| 2 223 335 | 4/1990 | United Kingdom . |

OTHER PUBLICATIONS

Sams Computerfacts Compaq Portable 101709 Computer with schematics, 93 sheets, 1987.

Kingston Technology Installation Guide—KTC–SLT 386/1, 2, & 4 Memory Expansion Boards for Compaq SLT 386s/20, 8 sheets, 1990.

(List continued on next page.)

Primary Examiner—Tan T. Nguyen
Attorney, Agent, or Firm—Conley, Rose & Tayon, PC; B. Noel Kivlin

[57] ABSTRACT

A single in-line memory module (SIMM) for memory expansion in a computer system. The SIMM includes a plurality of memory chips surface-mounted on a printed circuit board. The printed circuit board includes a dual read-out connector edge adapted for insertion within a socket of the computer system. One or more driver chips may further be mounted on the printed circuit board and connected to distribute control signals to the memory chips. A full-width data path may further be connected between the dual read-out connector edge and the plurality of memory chips.

51 Claims, 6 Drawing Sheets

U.S. PATENT DOCUMENTS

| | | | |
|---|---|---|---|
| 3,671,917 | 6/1972 | Ammon et al. | 339/17 |
| 3,680,038 | 7/1972 | Johnson | 439/325 |
| 3,701,078 | 10/1972 | Lynch | 439/329 |
| 3,912,353 | 10/1975 | Kasuya et al. | 439/329 |
| 3,982,807 | 9/1976 | Anhalt et al. | 439/280 |
| 4,077,694 | 3/1978 | Cobaugh et al. | 339/176 MP |
| 4,084,874 | 4/1978 | Georgopulos | 439/326 |
| 4,163,289 | 7/1979 | Schmidt | 365/51 |
| 4,164,751 | 8/1979 | Tasch, Jr. | 257/306 |
| 4,253,719 | 3/1981 | McGinley | 439/329 |
| 4,262,340 | 4/1981 | Sasaki et al. | 365/154 |
| 4,394,753 | 7/1983 | Penzel | 365/236 |
| 4,426,689 | 1/1984 | Henle et al. | 365/52 |
| 4,426,773 | 1/1984 | Hargis | 29/832 |
| 4,428,635 | 1/1984 | Hamsher, Jr. et al. | 439/265 |
| 4,500,906 | 2/1985 | Ohno et al. | 257/211 |
| 4,548,456 | 10/1985 | Robertson | 439/373 |
| 4,558,912 | 12/1985 | Coller et al. | 339/64 M |
| 4,651,416 | 3/1987 | DePaul | 29/174 |
| 4,656,605 | 4/1987 | Clayton | 365/52 |
| 4,682,207 | 7/1987 | Akasaki et al. | 257/700 |
| 4,695,111 | 9/1987 | Grabbe et al. | 439/266 |
| 4,696,529 | 9/1987 | Verhoeven et al. | 439/267 |
| 4,700,998 | 10/1987 | Hvezda et al. | 439/235 |
| 4,724,531 | 2/1988 | Angleton et al. | 365/181 |
| 4,727,513 | 2/1988 | Clayton | 365/152 |
| 4,740,868 | 4/1988 | Hawkins | 361/421 |
| 4,756,694 | 7/1988 | Billman et al. | 439/61 |
| 4,771,366 | 9/1988 | Blake et al. | 361/705 |
| 4,777,590 | 10/1988 | Durkos et al. | 395/800 |
| 4,781,612 | 11/1988 | Thrush | 439/328 |
| 4,796,224 | 1/1989 | Kawai et al. | 365/51 |
| 4,802,132 | 1/1989 | Ohsawa | 365/230.03 |
| 4,842,538 | 6/1989 | Noschese | 439/260 |
| 4,850,891 | 7/1989 | Walkup et al. | 439/326 |
| 4,850,892 | 7/1989 | Clayton | 439/326 |
| 4,879,631 | 11/1989 | Johnson | 361/386 |
| 4,882,700 | 11/1989 | Mauritz et al. | 439/51 |
| 4,884,237 | 11/1989 | Mueller et al. | 365/463 |
| 4,891,789 | 1/1990 | Quattrini et al. | 361/409 |
| 4,898,540 | 2/1990 | Saito | 439/153 |
| 4,946,403 | 8/1990 | Billman et al. | 439/326 |
| 4,958,322 | 9/1990 | Kosugi et al. | 365/189.01 |
| 4,973,270 | 11/1990 | Billman et al. | 439/630 |
| 4,984,064 | 1/1991 | Toshio et al. | 257/724 |
| 4,990,097 | 2/1991 | Billman et al. | 439/160 |
| 4,990,107 | 2/1991 | Fortuna | 357/637 |
| 4,992,849 | 2/1991 | Corbett et al. | 357/72 |
| 4,992,850 | 2/1991 | Corbett | 439/72 |
| 4,994,896 | 2/1991 | Uemura et al. | 257/724 |
| 5,021,866 | 6/1991 | Sudo et al. | 257/736 |
| 5,026,297 | 6/1991 | Krehbiel | 439/326 |
| 5,043,792 | 8/1991 | Adachi | 257/773 |
| 5,051,994 | 9/1991 | Bluethman et al. | 371/11.1 |
| 5,061,990 | 10/1991 | Arakawa et al. | 257/676 |
| 5,082,459 | 1/1992 | Billman et al. | 439/637 |
| 5,089,993 | 2/1992 | Neal et al. | 365/63 |
| 5,094,624 | 3/1992 | Baake et al. | 361/326 |
| 5,112,242 | 5/1992 | Choy et al. | 439/326 |
| 5,119,170 | 6/1992 | Iwamatsu | 257/773 |
| 5,126,910 | 6/1992 | Windsor et al. | 357/42 |
| 5,138,434 | 8/1992 | Corbett et al. | 439/74 |
| 5,145,396 | 9/1992 | Yeung | 365/326 |
| 5,157,635 | 10/1992 | Ellis et al. | 439/230 |
| 5,161,995 | 11/1992 | Baake et al. | 361/326 |
| 5,162,970 | 11/1992 | David, Jr. et al. | 361/32 |
| 5,162,979 | 11/1992 | Anzelone et al. | 439/415 |
| 5,164,916 | 11/1992 | Wu et al. | 365/52 |
| 5,167,517 | 12/1992 | Long | 439/160 |
| 5,169,333 | 12/1992 | Yang Lee | 439/296 |
| 5,191,404 | 3/1993 | Wu et al. | 257/724 |
| 5,192,220 | 3/1993 | Billman et aal. | 439/327 |
| 5,200,917 | 4/1993 | Shaffer et al. | 365/51 |
| 5,252,857 | 10/1993 | Kane et al. | 257/686 |
| 5,260,892 | 11/1993 | Testa | 365/63 |
| 5,263,870 | 11/1993 | Billman et al. | 439/108 |
| 5,265,218 | 11/1993 | Testa et al. | 395/325 |
| 5,270,964 | 12/1993 | Bechtolsheim et al. | 365/52 |
| 5,272,664 | 12/1993 | Alexander et al. | 365/52 |
| 5,307,309 | 4/1994 | Protigal et al. | 365/63 |
| 5,319,591 | 6/1994 | Takeda et al. | 365/63 |
| 5,339,269 | 8/1994 | Takagi | 365/52 |
| 5,383,149 | 1/1995 | Testa et al. | 365/52 |
| 5,420,824 | 5/1995 | Kajimoto et al. | 365/230.01 |
| 5,465,229 | 11/1995 | Bechtolsheim et al. | 365/52 |
| 5,532,954 | 7/1996 | Bechtolsheim et al. | 365/52 |

OTHER PUBLICATIONS

Kingston Technology KTC386/4000 (2001002) memory board color photocopies, 3 sheets, 1989.

Kingston Technology KTC386/4000 (2001002) memory board schematic, 4 sheets, 1989.

Kingston Technology KTV5000/16 (2001015) memory board color photocopies, 2 sheets, 1989.

Kingston Technology KTV5000/16 (2001015) memory board schematic, 3 sheets, 1989.

Kingston Technology KTC/SLT286–4 (2001075) memory board color photocopy, 1 sheet, 1989.

Kingston Technology KTC/SLT286–4 (2001075) memory board schematic, 2 sheets, 1989.

Kingston Technology KST4000/25 (2001086) memory board color photocopies, 2 sheets, 1990.

Kingston Technology KST4000/25 (2001086) memory board schematic, 2 sheets, 1990.

Kingston Technology KTC/SLT386–4 (2001090) memory board color photocopies, 3 sheets, 1990.

Kingston Technology KTC/SLT386–4 (2001090) memory board schematic, 3 sheets, 1990.

Kingston Technology KDG16000 (2001092) memory board color photocopies, 2 sheets, 1990.

Kingston Technology KDG16000 (2001092) memory board schematic, 3, sheets, 1990.

Kingston Technology KTV31764/4 (2001122) memory board color photocopies, 2 sheets, 1990.

Kingston Technology KTV3176/4 (2001122) memory board schematic, 3 sheets, Jan. 1991.

Kingston Technology KTC4000E (2001157) memory board color photocopies, 3 sheets, 1988.

Kingston Technology KTC4000E (2001157) memory board schematic, 6 sheets, 1988.

Compaq computer (Model #101709) memory board #RA 004163 color photocoy, 1 sheet, 1986.

Compaq SLT/286 computer (Model 2680) memory board #6C33027CM color photocopy, 1 sheet, 1988.

*Sun Microsystems, Inc.* v. *Dataram Corporation*, Complaint For Patent Infringement and Demand For Jury Trial dated Aug. 29, 1996 (9 pages).

*Sun Microsystems, Inc.* v *Dataram Corporation*, First Amended Answer and Counterclaims of Defendant Dataram Corporation dated Feb. 27, 1997 (29 pages).

Alford, R., "The Fastest Portable: IBM's P75 Road Warrior," BYTE, Apr. 1991, pp. 265–266 and 268.

Burton, E., "Transmission–Line Methods Aid Memory–Board Design; Understanding Transmission Line Effects Is The Way To Keep Up With The Ever Increasing Speed of Memories,"Design Applications, Dec. 8, 1988, pp. 87–91.

Technical Notice AViiON 4000 and 4020 Series Computer Systems, AViiON Product Line, Customer Documentation, Data General Corporation, Mar. 1990, (excerpts—16 double sided sheets and 1 colored sheet of 16M Memory Module).

Setting Up and Installing VMEbus Options in AViiON Systems, AViiON Product Line, Customer Documentation, data General Corporation, Mar. 1993, (excerpts including Appendices A and B—15 doubled sided sheets).

AViiON 300D Series Stations: Programming System Control and I/O Registers, AViiON Product Line, Customer Documentation, Data General Corporation, Aug. 1990, (excerpts including Chapters 1 and 2 and Appendix D—37 double sided sheets).

Expanding and Maintaining AViiON 3000 and 4000 Series and Computer Systems, AViiON Product Line, Customer Documentation, Data General Corporation, Jun. 1990. (excerpts including Appendix A, Index and Documentation Set—34 double sided sheets).

Technical Notice for AViiON 3000 and 4000 Series Systems: Programming System Control and I/O Registers, AViiON Product Line, Customer Documentation, Data General Corporation, Jun. 1990, (excerpts including Chapter 7 and Appendix D—24 double sided sheets).

Expanding and Maintaining AViiON 400 Series Stations, AVIION Product Line, Customer Documentation, Data General Corporation, Mar. 1990, (excerpts including Chapter 4 and Appendix B—12 double sided sheets).

Setting Up and Starting AViiON 400 Series Stations, AVIION Product Line, Customer Documentation, Data General Corporation, Mar. 1990, (excerpts including Appendices A and B—17 double sided sheets).

AViiON 100, 200, 300 and 400 Series Stations and AViiON 3000 and 4000 Series Systems: Programming System Control and I/O Registers, AVIION Product Line, Customer Documentation, Data General Corporation, Oct. 1991, (excerpts including Chapters 1, 2 and 4—62 double sided sheets).

Setting Up, Starting, Expanding, and Maintaining AViiON Computer Systems: 400, 3000, and 4000 Series,Customer Documentation, Data General Corporation, Oct. 1991, (excerpts including Chapters 1, 6 and 8 and Appendices A and B—54 double sided sheets).

Setting Up and Starting AViiON 300D Series Stations, Customer Documentation, Data General Corporation, Aug. 1990, (excerpts including Appendix A—17 double sided sheets).

Setting Up, Starting, and Maintaining AViiON 210, 300CD, and 310 CD Workstations, Customer Documentation, Data General Corporation, Jun. 1993, (excerpts including Chapters 1 and 4, Appendices A–C—52 double sided sheets).

Maintaining AViiON 300 Series Stations, Customer Documentation, Data General Corporation, Nov. 1989, (excerpts including Chapter 3, Appendix A—22 double sided sheets).

1991 IC Master: 3 Advertiser Technical Data (excerpts—39 double sided sheets).

Electronic Design: Loaded DSP chip speeds through advanced applications, Mar. 19, 1997 (2 double sided sheets).

VAXstation 3100 Model 76 Owner's Guide, Digital Equipment Corp. 1991, (excerpts including Chapters 7–9, Appendices C—E, —69 double sided sheets).

DECdirect: Desktop Edition, Winter/Spring 1991, pp. 1–3 and 44–67 (15 double sided sheets).

VAXstation 3100 Model 76 Maintenance Guide, Digital Equipment Corp. 1991, (excerpts including Chapters 2–4, –36 double sided sheets).

DECdirect: Add–Ons, Upgrades, Desktop Solutions and Supplies for all Digital Systems, Spring/Summer 1989, pp. 1–11 and 98–107 (12 double sided sheets).

Miyamoto, et al, "A Fast 256K×4 CMOS DRAM with a Distributed Sense and Unique Restore Circuit", E.E.E. Journal of Solid–State Circuits, vol. SC–22 (1987) Oct., No. 5, New York, U.S.A., pp. 861–866—double sided sheets).

Nakahara, "Complex Multilayer Boards Vie for Space in Japanese Computers" Electronic Packaging & Production, Feb. 1987, pp. 71–75—double sided sheets).

Minutes of Meeting Nos. 3–7 JC–42.5 Committee on Memory Cards and Modules; 1990–1991 (77 double sided sheets).

Minutes of Meeting Nos. 45–52 JC–42.3 Committee on MOS Memories, 1988–1989 (239 double sided sheets).

"HP720: Fast, Stylish", UniX Today, Apr. 1991 (1 double sided sheet).

"Multiprocessor Schemes: Which Is Best For You?", EDN, Apr. 1989 (3 double sided sheets).

Mitsubishi Electronics Advertisement: Transportable Memory Cards (1 sheet).

VLSI MOS Memory RAM/ROM & Memory Cards, $1^{st}$ Quarter 1992, Mitsubishi Electronic Device Group. (2 double sided sheets).

Prasad, R., Surface Mount Technology: Principles and Practice, Van Nostrand Reinhold, New York, 1989, pp. 10–13 and 38–39 (4 double sided sheets).

Sartore, R., "Seeking a Wide Berth,"BYTE Magazine, Nov. 1989, pp. 307–308, 310, 312–318 (5 double sided sheets).

Data Book MOS Memory: Commerical and Military Specifications, Texas Instruments, 1991, pp. 6–16–107 (57 double sided sheets).

Wawrzynek, R., "Tailor memory–system architecture for your chosen DRAM," Designer's Guide dynamic RAMs: Part 2, EDN Apr. 13, 1989, pp. 157–162 and 164 (4 double sided sheets).

IBM Personal System/2 Model 70 386 Quick Reference, Nov. 1987, (excerpts—12 double sided sheets and 2 colored sheets of IBM PS/2 2MB Memory Module and Memory Expansion Card).

IBM Personal System/2 Model P70 386 Quick Reference, Nov. 1987 (excerpts—9 double sided sheets).

IBM Personal System/2 Model P70 386 (Type 8573), Jan. 23, 1990, (excerpts—11 double sided sheets).

IBM 2–8MB 80386 Memory Expansion Option Technical Reference, Apr. 1988, (excerpts—11 double sided sheets).

IBM Portable PS/2 Models P70 and P75, Technical Awareness Information, Course 40646, Jan. 1991, (excerpts—22 double sided sheets).

IBM Product Announcement, IBM Personal System/2 Model P70 386 (8573–031) Mar. 20, 1990 (3 double sided sheets).

Apple IIGS Memory Expansion card Owner's Guide, 1986, Apple Computer, Inc., pp. iii–vi and Chapters 1, 2, and 3 (11 double sided sheets and 2 colored sheets).

Apple IIGS Owner'Guide, 1986, Apple Computer, Inc., pp. iii–xi and pp. 103, 124, 130–131, and 158 ( 8 double sided sheets).

DEC MS01 SIMM samples (1 colored sheet).

Gavilon Computer Memory Module (2 colored sheets).

HP 3006 Module (1 colored sheet).
Micron XCEED Card (1 colored sheet).
NCRO Module (1 colored sheet).
S–1 Memory Card Model #2065 (2 colored sheets).
High Performance Package for Memory; IBM Technical Disclosure Bulletin, vol. 21, No. 2, Jul. 1978.
Semiconductor Packaging Using "Chip Mate" Concept With Dual Inline Package (DIP) for Bonded Vias, Terminals and Reflowed Solder Pads and Using Chip Carrier for Reflowed Solder Pads and Bonded Terminals; IBM Technical Disclosure Bulletin, vol. 27, No. 11, Apr. 1985.
Dataram, Memory Upgrades for DECstation 2100/3100 and 5000/100 Series.
Dataram, Memory Upgrades for DECsystem 5500.
Dataram Memory for the AVIION Workstation, Paul Henke, dataram Corporation, pp. 1 and 2.
Samsung Electronics, KM41C1000C/C/CSL, 1M×1 Bit CMOS Dynamic RAM with Fast Page Mode, pp. 73 and 74.
Texas Instruments, 3 State Outputs Drive Bus Lines or Buffer memory Address Registers, pp. 2691 and 2692.
Dataram Announces Memory Boards for the DEC Microvax 3X00 Series Including a Single Board 32MB Version.
DEC–Compatible Memory Expansion Boards for Microvax 3X00 Series Computers, DR–300.
Wide Word System, Data Ram, The Off–the–Shelf Foundation for All High Speed Data Handling Problems, pp. 1–9.
Dataram, Memory Upgrades for VAX 6000, 1 page.
Brochure, "DR 5100 memory for DECsystem 5100, VAXstation 3100 Model 76, VAXstation 4000 Model 60 and 90 VAX 4000 Model 100, and Micro VAX 3100 Model 30, 40, 80 and 90 workstations", Dataram, The Memory Specialists Apr. 1993, 2 pages.
Texas Instruments, MOS Memory Data Book Commerical and Military Specifications, 1991, Houston, Texas pp. 6–1 through 6–107.
Mitsubishi Electric Corp., Semiconductor Marketing Division, Mitsubishi Semiconductors Memories RAM Databook, May 1990, Japan, pp. 1–1 through 6–60.
PERICOM Semiconductor Corp., Application brief–5, P174FCT162344T For Heavy Load Applications, pp. 692–693.
PERICOM Semiconductor Corp., Application Specific, P174FCT162244MT, Jun. 21, 1995 p. 1–8.
TeleMagic Enterprise, General Features and Specs, downloaded from http://www.telemagic.com/html/enspec1.htm, Jun. 11, 1997, 6 pages.
Lattice Semiconductor Corp., Specifications ispLSI® and pLSI 2032®, Sep. 1996, pp. 1–16.
Advanced Micro Devices, MACH211–7/10/12/15/20 High–Density EE CMOS Programmable Logic, Pub. #19601, Rev. B. Issue date: Sep. 1995, pp. 1–38.
Xilinx, Ordering Information, Jun. 1, 1996 (Version 1.0), 3 pages.
Lattice Semiconductor Corporation, Specifications GAL22LV10, 1996 Data Book, pp. 3–251 through 3–268.
Digital Equipment Corporation, Digital Storage Technology Handbook, 1989.
Digital Equipment Corporation, PDP–11 Architecture Handbook, 1983.
A. Feller et al., "Crosstalk and Reflections in High–Speed Digital Systems", Radio Corp. Of America Computer Advanced Product Research, Camden, New Jersey, pp. 511–525.

John A. DeFalco, "Reflection and Crosstalk in Logic Circuit Interconnections," Honeywell, Inc., IEEE Spectrum, Jul. 1970, pp. 45–50.0.
William K. Springfield, IBM Corp., "Designing Transmission Lines Into Multilayer Circuit Boards", Electronics, Nov. 1, 1965, pp. 90–96.
O. Gene Gabbard, COMSAT Laboratories, "High–Speed Digital Logic For Satellite Communications", Electro–Technology–Apr. 1969, pp. 59–65.
H.R. Kaupp, "Characteristics of Microstrip Transmission Lines", IEEE Transactions on Electronics Computers, Apr. 1967, pp. 185–193.
Digital Equipment Corporation, DECdirect catalog (RV), Fall/Winter 1989.
Digital Equipment Corporation, VAXBI Options handbook, 1986.
Motorola, Inc., MECL System Design handbook, Fourth Edition, 1983.
AMP Dual Read–Out SIMM Sockets, Supplement 82834, (May 1991), (4 pages).
AMP Product Specification (Tentative 108–1363, (12 pages).
AMP Customer Drawing 90–1439–24, (2 pages).
AMP Customer Drawing 91–1793–1, (2 pages).
Top, bottom and side views of Atari CX853 Memory Module (color copy), (1 page).
Top and bottom views Printed Circuit Board of Atari CX853 (color copy), (1 page).
Sams Computerfacts Technical Service Data, Atari Model 800 Computer, (41 pages).
Rockwell R650X and R651X Microprocessors (CPU) Data Sheet, (16 pages).
National Semiconductor 54ACQ/74ACQ244–54ACTQ/74ACTQ244 Quiet Series Octal Buffer/Line Driver with Tri–State Outputs, (10 pages).
Texas Instruments, SN54157 Data Sheet, (8 pages).
Texas Instruments, SN5410 Data Sheet, (1 page).
Texas Instruments, TMS4116 16, 348–Bit Dynamic Random–Access Memory Data Sheet, (14 pages).
Top and bottom views of Commodore VIC–1111 16K RAM Cartridge, (1 page).
Top and bottom views of printed circuit board of Commodore VIC–1111 16K RAM Cartridge, (1 page).
Sams Computerfacts Commodore Model VIC 20, 1984, (22 pages).
Sams Computerfacts Commodore Model VIC 20 (Early Version), 1985, (17 pages).
National Semiconductor 54LS138 Decoders/Demultiplexers Data Sheet, (8 pages).
Hitachi HM6116 Series Data Sheet, (5 pages).
Front and back views of DEC MS44–AA memory module (color copy), (1 page).
Texas Instruments SN54ALS1034 Hex Drivers Data Sheet, (6 pages).
Siemens HYB 511000BJ–50/60/70 Data Sheet, (22 pages).
Digital DECdirect Desktop Edition, Winter/Spring 1991 (excerpts), (14 pages).
Front and back views of Kingston Technology memory boards for HP Apollo 9000 Series 700 computers, (2 pages).
Kingston Technology KTH700/16, /32, /64 & /128 memory upgrade kits, documentation, (3 pages).
CE Handbook HP Apollo 9000 Series 700 Workstation/Servers, (247 pages).

| | | | |
|---|---|---|---|
| D< 0> | D< 0> | D< 32> | D< 32> |
| D< 1> | D< 1> | D< 33> | D< 33> |
| D< 2> | D< 2> | D< 34> | D< 34> |
| D< 3> | D< 3> | D< 35> | D< 35> |
| D< 4> | D< 4> | D< 36> | D< 36> |
| D< 5> | D< 5> | D< 37> | D< 37> |
| D< 6> | D< 6> | D< 38> | D< 38> |
| D< 7> | D< 7> | D< 39> | D< 39> |
| D< 8> | D< 8> | D< 40> | D< 40> |
| D< 9> | D< 9> | D< 41> | D< 41> |
| D< 10> | D< 10> | D< 42> | D< 42> |
| D< 11> | D< 11> | D< 43> | D< 43> |
| D< 12> | D< 12> | D< 44> | D< 44> |
| D< 13> | D< 13> | D< 45> | D< 45> |
| D< 14> | D< 14> | D< 46> | D< 46> |
| D< 15> | D< 15> | D< 47> | D< 47> |
| D< 16> | D< 16> | D< 48> | D< 48> |
| D< 17> | D< 17> | D< 49> | D< 49> |
| D< 18> | D< 18> | D< 50> | D< 50> |
| D< 19> | D< 19> | D< 51> | D< 51> |
| D< 20> | D< 20> | D< 52> | D< 52> |
| D< 21> | D< 21> | D< 53> | D< 53> |
| D< 22> | D< 22> | D< 54> | D< 54> |
| D< 23> | D< 23> | D< 55> | D< 55> |
| D< 24> | D< 24> | D< 56> | D< 56> |
| D< 25> | D< 25> | D< 57> | D< 57> |
| D< 26> | D< 26> | D< 58> | D< 58> |
| D< 27> | D< 27>  J0301 | D< 59> | D< 59> |
| D< 28> | D< 28> | D< 60> | D< 60> |
| D< 29> | D< 29> | D< 61> | D< 61> |
| D< 30> | D< 30> | D< 62> | D< 62> |
| D< 31> | D< 31> | D< 63> | D< 63> |
| CBW< 0> | CBW< 0> | CBW< 4> | CBW< 4> |
| CBW< 1> | CBW< 1> | CBW< 5> | CBW< 5> |
| CBW< 2> | CBW< 2> | CBW< 6> | CBW< 6> |
| CBW< 3> | CBW< 3> | CBW< 7> | CBW< 7> |
| ROE* | ROE* | BUSY* | BUSY* |
| VIRQ* | VIRQ* | SIRQ* | SIRQ* |
| RAS1* | RAS1* | RAS0* | RAS0* |
| CAS1* | CAS1* | CAS0* | CAS0* |
| A< 1> | A< 1> | A< 0> | A< 0> |
| A< 3> | A< 3> | A< 2> | A< 2> |
| A< 5> | A< 5> | A< 4> | A< 4> |

Connector: CONN200

*Figure 4a*

| A< 7> | A< 7> | A< 6> | A< 6> |
|---|---|---|---|
| A< 9> | A< 9> | A< 8> | A< 8> |
| A< 11> | A< 11> | A< 10> | A< 10> |
| MEMRESET* | MEMRESET* | WE* | WE* |
| IOSEL* | IOSEL* | MCLK | MCLK |
| D< 64> | D< 64> | D< 96> | D< 96> |
| D< 65> | D< 65> | D< 97> | D< 97> |
| D< 66> | D< 66> | D< 98> | D< 98> |
| D< 67> | D< 67> | D< 99> | D< 99> |
| D< 68> | D< 68> | D< 100> | D< 100> |
| D< 69> | D< 69> | D< 101> | D< 101> |
| D< 70> | D< 70> | D< 102> | D< 102> |
| D< 71> | D< 71> | D< 103> | D< 103> |
| D< 72> | D< 72> | D< 104> | D< 104> |
| D< 73> | D< 73> | D< 105> | D< 105> |
| D< 74> | D< 74> | D< 106> | D< 106> |
| D< 75> | D< 75> | D< 107> | D< 107> |
| D< 76> | D< 76> | D< 108> | D< 108> |
| D< 77> | D< 77> | D< 109> | D< 109> |
| D< 78> | D< 78> | D< 110> | D< 110> |
| D< 79> | D< 79> | D< 111> | D< 111> |
| D< 80> | D< 80> | D< 112> | D< 112> |
| D< 81> | D< 81> | D< 113> | D< 113> |
| D< 82> | D< 82> | D< 114> | D< 114> |
| D< 83> | D< 83> | D< 115> | D< 115> |
| D< 84> | D< 84> | D< 116> | D< 116> |
| D< 85> | D< 85> | D< 117> | D< 117> |
| D< 86> | D< 86> | D< 118> | D< 118> |
| D< 87> | D< 87> | D< 119> | D< 119> |
| D< 88> | D< 88> | D< 120> | D< 120> |
| D< 89> | D< 89> | D< 121> | D< 121> |
| D< 90> | D< 90> | D< 122> | D< 122> |
| D< 91> | D< 91> | D< 123> | D< 123> |
| D< 92> | D< 92> | D< 124> | D< 124> |
| D< 93> | D< 93> | D< 125> | D< 125> |
| D< 91> | D< 94> | D< 126> | D< 126> |
| D< 92> | D< 95> | D< 127> | D< 127> |
| CBW< 8> | CBW< 8> | CBW< 12> | CBW< 12> |
| CBW< 9> | CBW< 9> | CBW< 13> | CBW< 13> |
| CBW< 10> | CBW< 10> | CBW< 14> | CBW< 14> |
| CBW< 11> | CBW< 11> | CBW< 15> | CBW< 15> |

SINGLE IN-LINE MEMORY MODULE

This is a continuation application of Ser. No. 08/643,094, filed May 2, 1996 now abandoned which is a continuation of Ser. No. 08/473,073, filed Jun. 7, 1995, now U.S. Pat. No. 5,532,954 issued Jul. 2, 1996, which is a continuation of Ser. No. 08/345,477 filed Nov. 28, 1994, now U.S. Pat. No. 5,465,229 issued Nov. 7, 1995, which is a continuation of Ser. No. 08/279,824, filed Jul. 25, 1994, now U.S. Pat. No. 5,383,148 issued Jan. 17, 1995, which a continuation of Ser. No. 08/115,438, filed Sep. 1, 1993, now abandoned, which is a continuation of Ser. No. 07/886,413, filed May 19, 1992, now U.S. Pat. No. 5,270,964, issued on Dec. 14, 1993.

BACKGROUND OF THE INVENTION

1. Related Applications

This application is related to U.S. Pat. No. 5,260,892, entitled "High Speed Electrical Signal Interconnect Structure", issued Nov. 9, 1993 and U.S. Pat. No. 5,265,218, entitled 'Bus Architecture for Integrated Data and Video Memory', issued Nov. 23, 1993.

2. Field of the Invention

The present invention relates to the field of computer systems and memory hardware. More particularly, the present invention relates to modular circuit boards which may be combined to form a memory structure within a computer system.

3. Art Background

Single In-Line Memory Modules ("SIMMs") are compact circuit boards designed to accommodate surface mount memory chips. SIMMs were developed to provide compact and easy to manage modular memory components for user installation in computer systems designed to accept such SIMMs. SIMMs generally are easily inserted into a connector within the computer system, the SIMM thereby deriving all necessary power, ground, and logic signals therefrom.

A SIMM typically comprises a multiplicity of random access memory ("RAM") chips mounted to a printed circuit board. Depending on the user's needs, the RAM memory chips may be dynamic RAM (DRAM), non volatile static RAM (SRAM) or video RAM (VRAM). Because DRAM memories are larger and cheaper than memory cells for SRAMs, DRAMs are widely used as the principal building block for main memories in computer systems. SRAM and VRAM SIMMs have more limited application for special purposes such as extremely fast cache memories and video frame buffers, respectively. Because DRAMs form the largest portion of a computer system memory, it is therefore desirable that memory modules flexibly accommodate the computation needs of a user as the users' requirements change over time. Moreover, it is desirable that the SIMM modules may be added to the computer system with a minimum user difficulty, specifically in terms of configuration of a SIMM within a particular memory structure. In the past, SIMMs have generally been designed to provide memory increments of one or more megabytes (MB), but where the memory addition comprises only a portion of the full data path used in the computer system. A leading example of the prior art organization and structure is that disclosed in U.S. Pat. No. 4,656,605, issued Apr. 7, 1987 to Clayton. Clayton discloses a compact modular memory circuit board to which are mounted nine memory chips which are arranged to provide memory increments in eight bit (one byte) data widths, plus parity bits. Thus, because most computer systems use data paths of 32, 64 or more bits, the SIMM constructed according to Clayton cannot provide a memory increment for the entire data path. Instead the user must obtain and install multiple SIMMs, in combination with performing any additional configuration requirements necessary to make the separate SIMMs modules function as a single memory unit, such as setting base addresses for the SIMM modules installed.

As a result, a user seeking to increase his usable main memory by adding SIMMs constructed according to the prior art, typically must insert multiple SIMMs to achieve a memory expansion for the entire data path of his computer. The foregoing is a consequence of typical prior art SIMM architecture, wherein the SIMM is arranged around DRAM parts which comprise one byte wide memory increments. Thus in a data path having a width of 32 bits, there being eight bits per byte, a 1 megabyte expansion of main memory using SIMMs constructed according to the prior art would require four SIMM modules each of one megabyte capacity in order to obtain a full data path expansion of one megabyte.

As will be described in more detail in the following detailed description, the present invention provides, among other attributes, facility for providing memory expansion in full data path widths, thereby relieving the user of configuring and installing multiple SIMMs modules to obtain any desired memory increment.

SUMMARY OF THE INVENTION

A full width single in-line memory module (SIMM) for dynamic random access memory (DRAM) memory expansions is disclosed. A printed circuit board having a multiplicity of DRAM memory elements mounted thereto is arranged in a data path having a width of 144 bits. The SIMM of the present invention further includes on-board drivers to buffer and drive signals in close proximity to the memory elements. In addition, electrically conductive traces are routed on the circuit board in such a manner to reduce loading and trace capacitance to minimize signal skew to the distributed memory elements. The SIMM further includes a high pin density dual read-out connector structure receiving electrical traces from both sides of the circuit board for enhanced functionality. The SIMM is installed in complementary sockets one SIMM at a time to provide memory expansion in full width increments. Finally, symmetrical power and ground routings to the connector structure insure that the SIMM cannot be inserted incorrectly, wherein physically reversing the SIMM in the connector slot will not reverse power the SIMM.

BRIEF DESCRIPTION OF THE DRAWINGS

The objects, features and advantages of the present invention will be apparent from the following detailed description given below and from the accompanying drawings of the preferred embodiment of the invention in which:

FIGS. 4a and 4b are a connector diagram illustrating data, address and control signals routed to a SIMM.

DETAILED DESCRIPTION OF THE INVENTION

A bus architecture for integrated data and video memory is disclosed. In the following description, for purposes of explanation, specific numbers, times, signals etc., are set forth in order to provide a thorough understanding of the present invention. However, it will be apparent to one skilled in the art that the present invention may be practiced without these specific details. In other instances, well known circuits and devices are shown in block diagram form in order not to obscure the present invention unnecessarily.

The preferred embodiment of the SIMM described herein is designed and intended to be used with the integrated data and video memory bus disclosed in copending U.S. patent application Ser. No. 07/886,671, filed May 19, 1992, now U.S. Pat. No. 5,265,218, issued Nov. 23, 1993 entitled "A Bus Architecture For Integrated Data and Video Memory". It will be apparent, however, to those skilled in the art that the specifications disclosed herein can or may be changed without departing from the scope of the present invention. Although the preferred embodiment of the present invention is disclosed in terms of the data path width matching that of the integrated data and video memory bus disclosed in the above-referenced U.S. patent application, it will be appreciated that changing the design of the bus is within the scope of the present invention, wherein the SIMM may be matched to the data path width of the integrated memory bus.

Figure 1A:
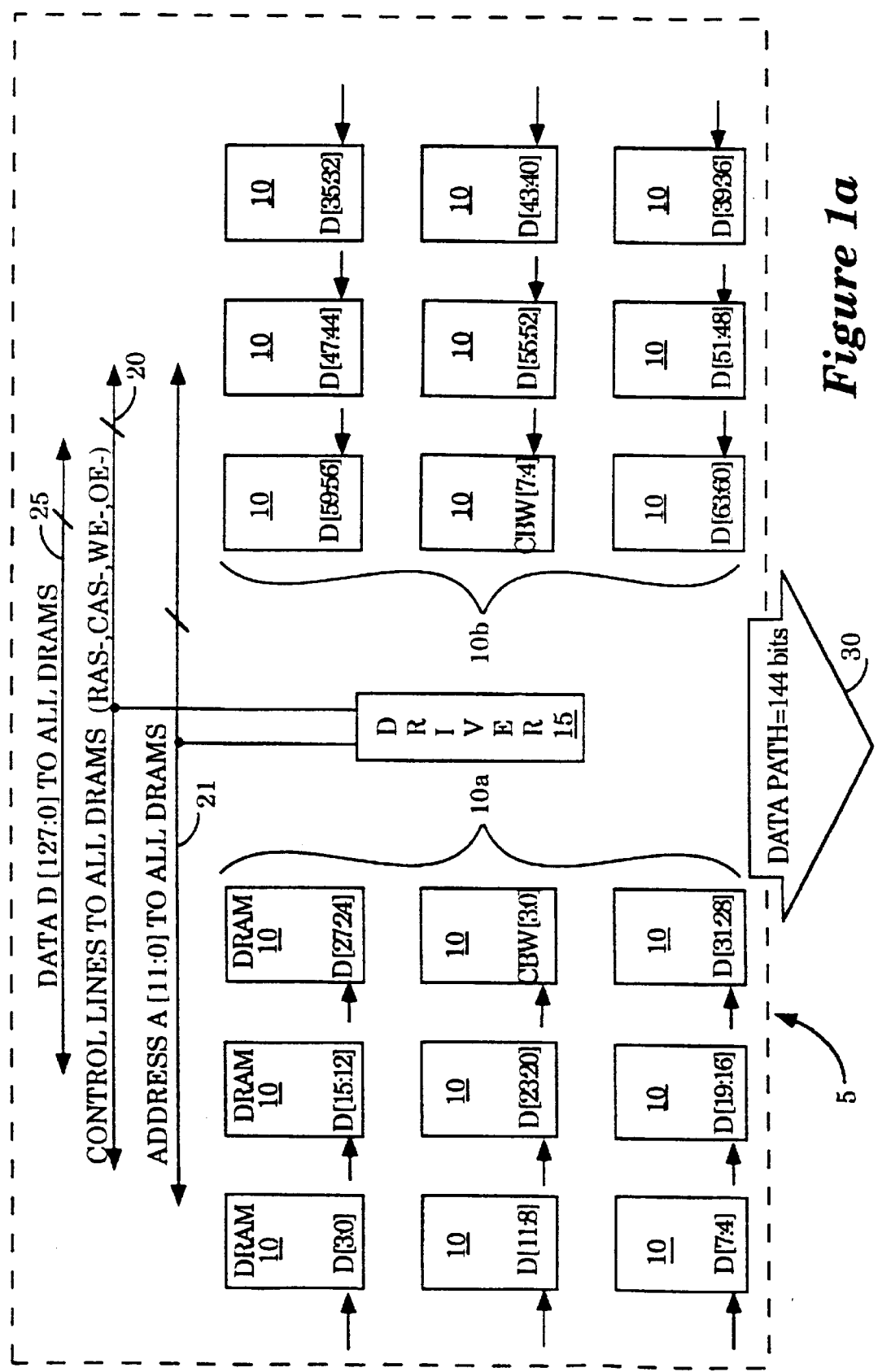
FIG. 1a illustrates the electrical schematic of a first side of the single in-line memory module (SIMM) according to the teachings of the present invention.

Reference is now made to FIG. 1a wherein an electrical block diagram of memory elements mounted to a first, obverse side of the SIMM is shown. In FIG. 1a, a multiplicity of dynamic RAM (DRAMs) are grouped into two clusters 10a and 10b. There are nine DRAMs 10 in each cluster. A driver 15 receives control signals, and address signals from an external bus arrangement (not shown) through a dual sided connector 30. A multiplicity of control lines 20 route RAS-(row access strobe), CAS- (column access strobe), WE- (write enable), and OE- (output enable), control signals from driver 15 to all the DRAMs 10 mounted to SIMM 5. Moreover, driver 15 buffers and subsequently distributes address signals 21 to all DRAMs 10 mounted to SIMM 5. For purposes of clarity in the present figure, the specific routing of data, address and control lines to all the DRAMs 10 is omitted. However, as can be seen from FIG. 1a, all DRAMs 10 have four data lines, DRAMs 10 being any of several commercially available DRAMs arranged in a "by-four" configuration. As will be seen below in connection with FIG. 1b, DRAMs 10 each of DRAM clusters 10a and 10b are matched with mirror image DRAMs 10 mounted to the opposite side of SIMM 5 and placed in electrical communication by electrical traces passing through a multiplicity of vias (not shown).

The specific routing of the electrical traces on SIMM 5 are dependent upon the specific architecture of the memory chips chosen for a specific implementation of SIMM 5. However, all SIMMs 5 constructed according to the teachings of the present invention have a full width data path extending from connector 30 to all devices operating on SIMM 5, including all DRAMs 10, driver 15, and any other logic elements necessary to implement the desired function of SIMM 5. As presently preferred, SIMM 5 embodies a 144 bit data path, comprising 128 data lines (DATA[127:0]), 16 error correction lines (CBW[15:0]) which implement a known error correction code, one RAS-, two CAS- signals, one WE signal and one reset line. The routing for all control signals 20, address signals 21 and data signals 25 minimize conductive trace capacitance and loading in accordance with U.S. Pat. No. 5,260,892, entitled 'High Speed Electrical Signal Interconnect Structure', assigned to the assignee of the present invention, and which is incorporated herein by reference. The trace routing control for all control signals 20 are taken from driver 15 to the central DRAM 10 for each DRAM cluster 10a, 10b, 10c, and 10d. DRAMs surrounding the central DRAM 10 are coupled to control signals 20 via short sub traces (not shown), thereby minimizing total capacitance, and increasing signal rise times.

Figure 3:
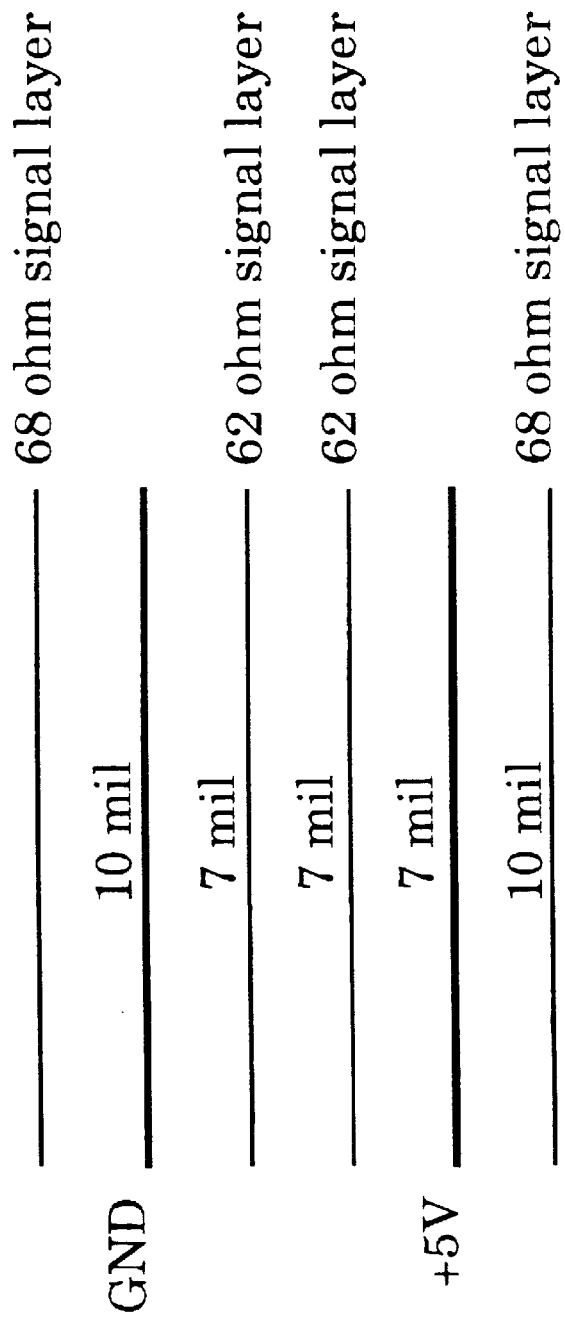
FIG. 3 illustrates the stacked conductive layers separated by insulating dielectric necessary to build up the interconnections for the electrical schematic shown in FIGS. 1a and 1b.

With brief reference to FIG. 3, the stack up used to route all control, addresses, data, and power and ground signals is illustrated. In the embodiment shown in FIG. 3, the printed circuit board is a multi-layered board including several signal layers.

Figure 1B:
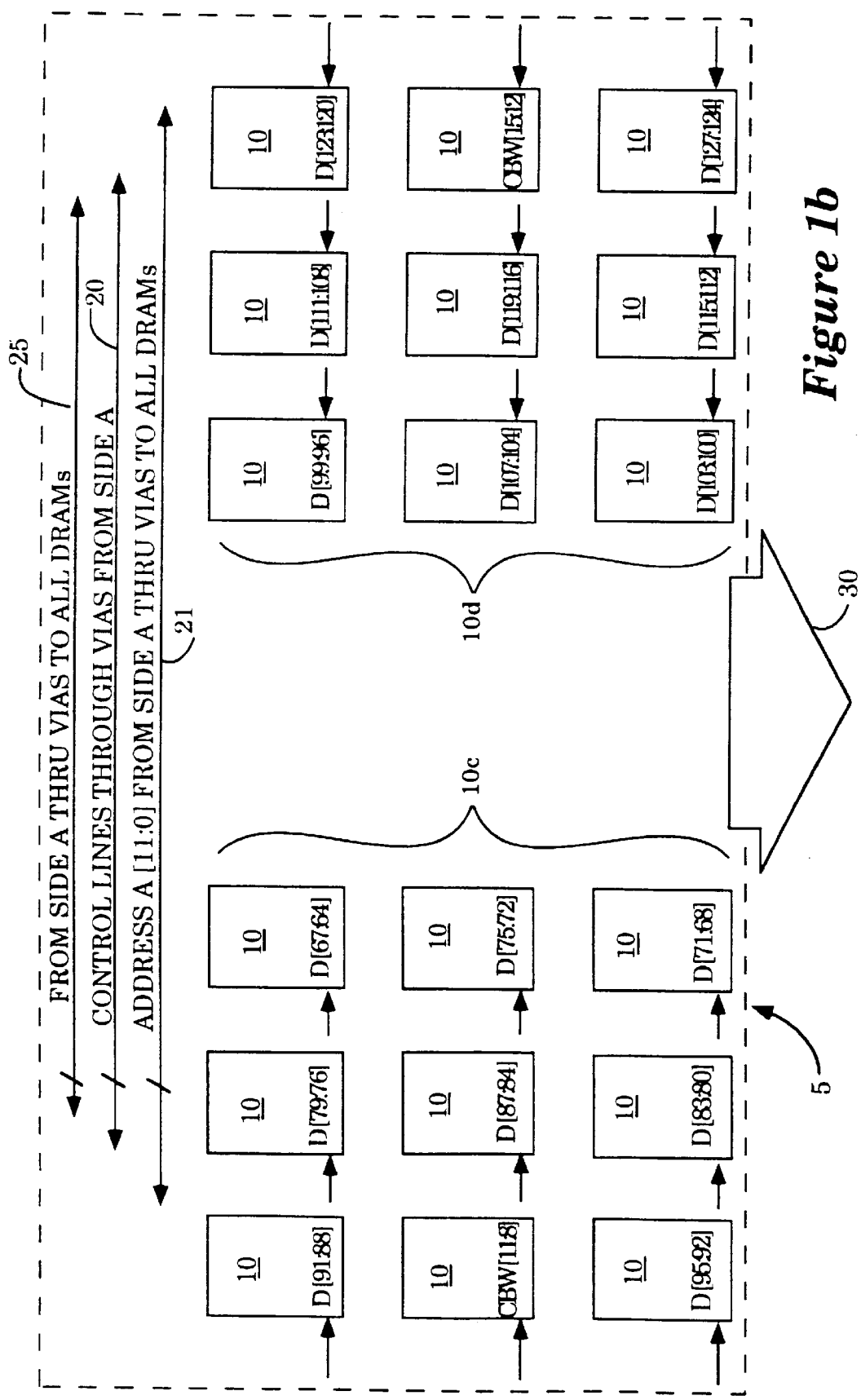
FIG. 1b illustrates the electrical schematic for a left-to-right mirror image layout of memory elements on a second side of the SIMM.

With brief reference to FIG. 1b, a second, reverse side of SIMM 5 is shown. In FIG. 1b, two additional DRAM clusters 10c and 10d are shown arranged as DRAM clusters 10a and 10b on the obverse side. Each DRAM 10 in DRAM clusters 10c and 10d similarly receives four input line, in addition to address and control lines passed from driver 15 on the obverse side through conductive vias to the mirror image reverse side of SIMM 5, thereby doubling the available surface area to which DRAMs 10 may be mounted. Moreover, SIMM 5 as presently preferred utilized thin small outline package (TSOP) DRAMs 10 to reduce overall thickness of SIMMs 5. When thus constructed, the double sided SIMM 5 of the present invention is no thicker than prior art single sided SIMMs (e.g., as taught by Clayton).

Briefly referring to FIG. 4, the high number density connector 30 used to connect SIMM 5 to the memory module socket (not shown) is illustrated. In FIG. 4, connector 30 is seen to have 200 pin terminations, therefore permitting a large number of signals to be routed to and from SIMM 5. In the preferred embodiment of SIMM 5, it is intended that SIMM 5 specifically incorporate the data path architecture consistent with an integrated data and video memory bus such as that described in above referenced copending U.S. Patent Applications assigned to Sun Microsystems, Inc., Mountain View, Calif., which is hereby incorporated herein by reference. In particular, the data path architecture implemented on SIMM 5 includes 128 data lines, 16 error correction code lines (referred to CBW [15:0] in FIGS. 1–6), in addition to a multiplicity of control signals necessary to accomplish DRAM memory accesses. Such control signals, collectively referred to control lines 20 in FIGS. 1a and 1b, include one RAS- per SIMM 5, two CAS- signals, one WE-, and one reset line. Thus, not including the control signals 20 which are used for controlling operation of DRAMs 10, the data path used for transmission of data to and from DRAMs 10 is seen to be 144 bits wide. Disregarding the error correction code signals, referred to in FIGS. 1–4b as CBW [15:0], the actual data path width of SIMM 5 for writing and reading data to and from memory is 128 bits wide, or sixteen bits, identical to that of the integrated data and video memory bus. Accordingly, SIMM 5 of the present invention may be installed into the memory bus in full width increments.

A total memory capacity available on a SIMM 5 may be computed as follows. Depending on the capacity of each RAM 10 mounted to SIMM 5 the total memory capacity of each SIMM module 5 can vary from four megabytes (MB) to a maximum of sixty-four MB, distributed over a total of thirty-six DRAMs 10. Using commercially available 256K× 41 Mbit DRAMs 10, four megabytes of memory may be provided on SIMM 5. Alternatively, when 16 megabit parts become available, because the addressable address space of SIMM 5 is very large, greater than two gigabits, SIMM 5 can easily accommodate the higher 16 megabit parts and make available a total capacity of 64 megabytes on a SIMM 5 having 36 DRAMs mounted to it.

Operation of SIMM 5 is controlled by control signals 20 as will be briefly discussed below. For a complete discussion on the actual operation of SIMM 5 in connection with the integrated data and video bus, the reader is referred to the above copending U.S. Patent Application, entitled "A Bus Architecture".

Figure 2A:
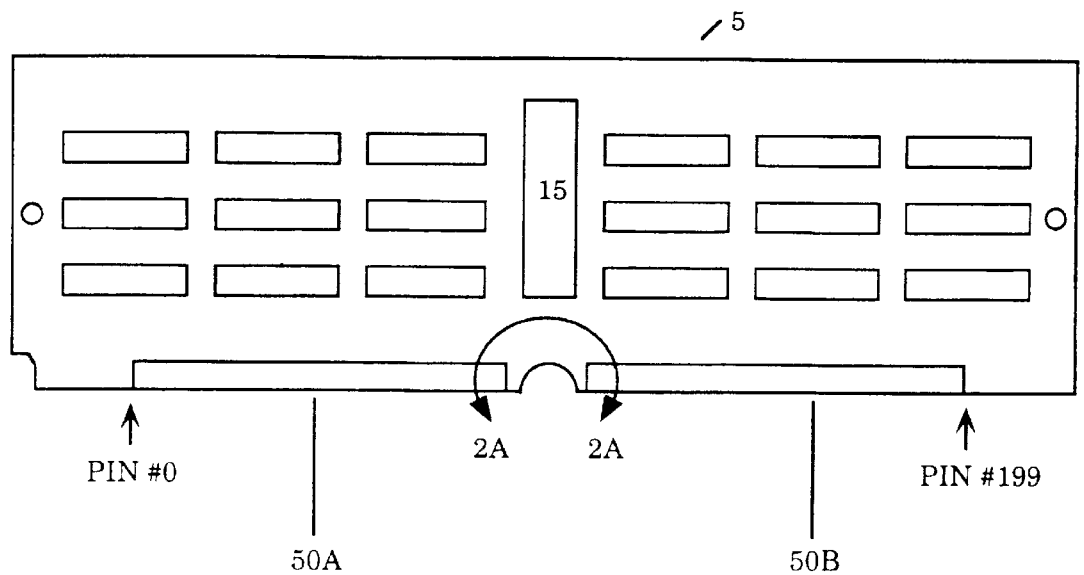
FIG. 2a illustrates the physical layout of the memory elements and drivers placed on the SIMM.
Figure 2B:
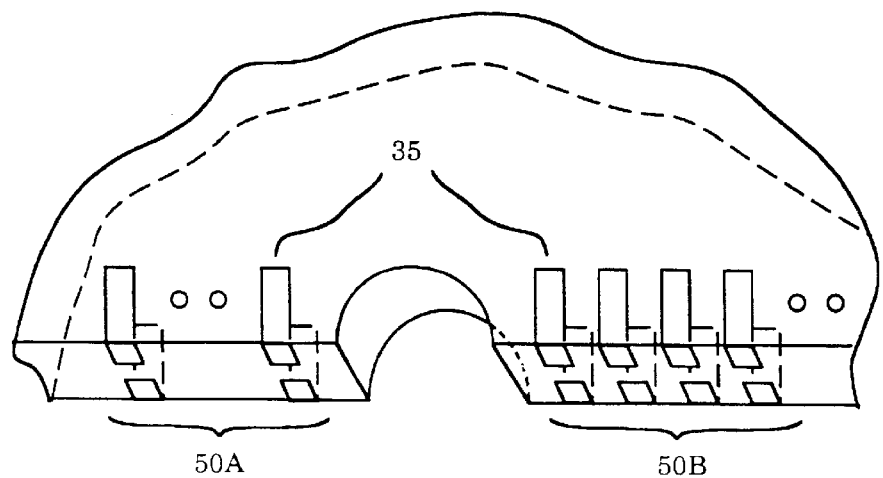
FIG. 2b is a magnified view of the dual read-out connector structure on the SIMM.

Reference is now made to FIG. 2, wherein the physical arrangement of DRAMs 10 and driver 15 are illustrated on SIMM 5. In addition to the DRAM clusters 10a and 10b shown on the obverse side of SIMM 5, the SIMM 5 is noted to have two contact regions 50a and 50b on the lower edge of SIMM 5. Contact regions 50a and 50b consist of narrowly spaced conductive contact pads running longitudinally across the bottom edge of SIMM 5 from pin 0 to pin 199, corresponding in number to the connector map illustrated in FIGS. 4a and 4b and the pinout summary in Table 1 illustrated below.

TABLE 1

SIMM Pin Descriptions

| Pin | Descriptions |
|---|---|
| D<0–127> | Data Bits |
| A<0–11> | Address Bits |
| CBW<0–7> | Check Bit Write Enables/data bus to on board devices used in Video SIMM |
| CBW<8–15> | Check Bit Write Enables |
| CAS<0–1>* | Column Address Strobes |
| RAS<0–1>* | Row Address Strobes |
| BUSY* | Video Frame Buffer Busy Signal - indicates that frame buffer is busy doing refresh or reload operations |
| SIRQ* | UART Interrupt |
| VIRQ* | Video Interrupt |
| WE* | Write Enable |
| MRST* | Reset Signal |
| MCLK | Mbus Clock - Sent to the VBC |
| IOSEL* | Differentiates between memory address space and I/O address space |
| ROE* | Currently used by VSIMM to generate DTOE signals. OE* on the DSIMMs is tied to Ground. |

In FIG. 2, a detail of the bottom edge of SIMM 5 is shown in FIG. 2a, a magnified view of the contact region of contact regions 50a and 50b are shown in perspective view. In FIG. 2a, it is seen that contact regions 50a and 50b consist of a large number of closely spaced contact pads 35 on the obverse side of SIMM 5 and a mirror image yet electrically distinct set of contact pads 36 on the reverse side of SIMM 5. In contrast to SIMMs constructed according to the prior art, the SIMM 5 of the present invention doubles the pinout capacity of a SIMM by "breaking" the connection between the obverse and reverse sides of SIMM 5, thereby effectively doubling the edge area which may be dedicated to electrical functions. For purposes of clarity, in contrast to prior art SIMM modules having contact pins placed on 0.1" centers, the spacing of contacts 35 and 36 on SIMM 5 are placed on 0.050" centers, the contact pads 35 and 36 themselves being 0.040" in lateral dimension thereby yielding a space of 0.010" between contact pads. However, the precise spacing and dimensions is not specific to the present invention, and it will be obvious to those skilled in the art that numerous spacing and pad placement schemes are possible using the "dual read out" arrangement as illustrated in FIG. 2a in contact regions 50a and 50b. Thus, operating together, the reduced spacing and dual readout arrangement of contact regions 50a and 50b provide a vastly improved pinout density available for SIMM modules, over four times that suggested by Clayton. In particular, because 200 pins are available for use on SIMM 5, the full data path width of 144 bits in addition to control signals and power and ground connections is accommodated by connector 30 and connector regions 50a and 50b of SIMM 5.

As previously noted in connection with the memory capacities according to the type of DRAM 10 installed on SIMM 5, it should be appreciated that the principal benefit of SIMM 5 constructed according to the teachings of the present invention is that memory expansion may be accommodated in full data path width increments. In contrast to memory expansion using SIMMs of the prior art, use of SIMM 5 in expanding memory, especially memory in association with integrated data and video memory of the above referenced copending application, memory may be expanded one SIMM at a time, and does not require multiple modules to be inserted to gain a single increment in memory expansion. The above result is principally derived from the accommodation of a full data path signal path on SIMM 5, thus facilitating easy installation of additional memory.

Finally, connector 30 further provides for power and ground to be connected to all DRAMs 10 and driver 15. Notably, all power and ground leads are symmetrically arranged within Connector 30, as is more clearly seen in Table 2 illustrated below.

TABLE 2

| Base | +1 | +2 | +3 | +4 | +5 | +6 | +7 | +8 |
|---|---|---|---|---|---|---|---|---|
| 0 | GND | GND | D0 | D7 | D1 | D6 | D2 | D5 |
| 8 | D3 | D4 | D32 | D39 | D33 | D38 | D34 | D37 |
| 16 | VCC | VCC | D35 | D36 | D8 | D15 | D9 | D14 |
| 24 | D10 | D13 | D11 | D12 | D40 | D47 | D41 | D46 |
| 32 | GND | GND | D42 | D45 | D43 | D44 | D16 | D23 |
| 40 | D17 | D22 | D18 | D21 | D19 | D20 | D48 | D55 |
| 48 | VCC | VCC | D49 | D54 | D50 | D53 | D51 | D52 |
| 56 | D24 | D31 | D25 | D30 | D26 | D29 | D27 | D28 |
| 64 | GND | GND | D56 | D63 | D57 | D62 | D58 | D61 |
| 72 | D59 | D60 | CBW0 | CBW7 | CBW1 | CBW6 | CBW2 | CBW5 |
| 80 | VCC | VCC | CBW3 | CBW4 | -CAS0 | -CAS1 | -RAS0 | -RAS1 |
| 88 | -ROE | -BUSY | -VIRQ | -SIRQ | A0 | A1 | A2 | A3 |
| 96 | A4 | A5 | GND | GND | GND | GND | A6 | A7 |
| 104 | A8 | A9 | A10 | A11 | -MRST | -WE | -IOSEL | MCLK |
| 112 | GND | GND | GND | GND | CBW8 | CBW15 | VCC | VCC |

TABLE 2-continued

| Base | +1 | +2 | +3 | +4 | +5 | +6 | +7 | +8 |
|------|------|------|------|------|------|------|------|------|
| 120 | CBW9 | CBW14 | CBW10 | CBW13 | CBW11 | CBW12 | D64 | D71 |
| 128 | D65 | D70 | D66 | D69 | D67 | D68 | GND | GND |
| 136 | D96 | D103 | D97 | D102 | D98 | D101 | D99 | D100 |
| 144 | D72 | D79 | D73 | D78 | D74 | D77 | VCC | VCC |
| 152 | D75 | D76 | D104 | D111 | D105 | D110 | D106 | D109 |
| 160 | D107 | D108 | D80 | D87 | D81 | D86 | GND | GND |
| 168 | D82 | D85 | D83 | D84 | D112 | D119 | D113 | D118 |
| 176 | D114 | D117 | D115 | D116 | D88 | D95 | VCC | VCC |
| 184 | D89 | D94 | D90 | D93 | D91 | D92 | D120 | D127 |
| 192 | D121 | D126 | D122 | D125 | D123 | D124 | GND | GND |

Power (VCC) and ground (GND) leads are seen to alternate every sixteen pins. If a SIMMS were inadvertently inserted in a reversed position into a memory module socket, the symmetrical power ground leads prevent the SIMM 5 from being reverse-powered, and likely destroyed.

The foregoing has described a physical architecture for a single in-line memory module compatible with an integrated data and video memory. It is contemplated that changes and modifications may be made by one or ordinary skill in the art, to the device components and arrangements of the elements of the present invention without departing from the spirit and scope of the invention. In particular, it is anticipated that SIMM 5 may be used with memory arrangements other than the integrated data and video memory incorporated by reference from the above-referenced copending application. However, SIMM 5 is optimally designed for use in the integrated video memory, and the user would derive optimal benefit from use in such a system.

While the invention has been described in conjunction with the preferred embodiment, it is evident that numerous alternative modifications, variations and uses will be apparent to those skilled in the art in light of the foregoing description.

We claim:

1. A single in-line memory module for memory expansion in a computer system, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board;

a driver chip mounted on the printed circuit board, wherein the driver chip is connected to distribute at least one control signal to the plurality of memory chips; and a data path at least 64 bits in width provided between the connector edge of the printed circuit board and the plurality of memory chips;

wherein the printed circuit board is a multi-layered printed circuit board including at least three signal layers.

2. The single in-line memory module as recited in claim 1 wherein the first and second plurality of contact pads include a total of at least 200 contact pads available for providing electrical connection to the socket.

3. The single in-line memory module as recited in claim 1 wherein the data path is at least 128 bits wide.

4. The single in-line memory module as recited in claim 1 wherein the first and second plurality of contact pads are disposed substantially along the entire length of one edge of the printed circuit board.

5. The single in-line memory module as recited in claim 1 wherein the first and second plurality of contact pads include contact pads dedicated for data comprising an error correction code.

6. The single in-line memory module as recited in claim 1 wherein all signals necessary for operation of the single in-line memory module are provided through the connector edge.

7. A single in-line memory module for memory expansion in a computer system, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board; and a full-width data path at least 64 bits in width provided between the connector edge of the printed circuit board and the plurality of memory chips;

wherein the printed circuit board is a multi-layered printed circuit board including at least three signal layers.

8. The single in-line memory module as recited in claim 7 wherein the full-width data path is at least 128 bits wide.

9. The single in-line memory module as recited in claim 7 wherein the connector edge extends substantially along the entire length of the printed circuit board.

10. The single in-line memory module as recited in claim 7 wherein the first and second plurality of contact pads include contact pads dedicated for data comprising an error correction code.

11. A single in-line memory module for memory expansion in a computer system, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board; and a data path at least 64 bits in width provided between the connector edge of the printed circuit board and the plurality of memory chips;

wherein the printed circuit board is a multi-layered printed circuit board including at least three signal layers.

12. The single in-line memory module as recited in claim 11 wherein the first and second plurality of contact pads include a total of at least 200 contact pads available for providing electrical connection to the socket.

13. The single in-line memory module as recited in claim 11 wherein the data path is at least 128 bits wide.

14. The single in-line memory module as recited in claim 11 wherein the connector edge extends substantially along the entire length of the printed circuit board.

15. The single in-line memory module as recited in claim 11 wherein the plurality of memory chips comprises dynamic random access memory (DRAM) chips.

16. The single in-line memory module as recited in claim 11 wherein the connector edge includes first and second contact regions arranged along a particular edge of the printed circuit board, wherein the particular edge includes an indentation between the first and second contact regions.

17. The single in-line memory module as recited in claim 11 wherein all signals necessary for operation of the single in-line memory module are provided through the connector edge.

18. The single in-line memory module as recited in claim 11 wherein the contact pads of the first plurality of contact pads are spaced with a center-to-center spacing of approximately 0.050 inch.

19. A single in-line memory module for memory expansion in a computer system, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board;

a driver chip mounted on the printed circuit board between a first set of the plurality of memory chips and a second set of the plurality of memory chips, wherein the driver chip is connected to distribute at least one control signal to the plurality of memory chips; and a data path at least 64 bits in width provided between the connector edge of the printed circuit board and the plurality of memory chips;

wherein the printed circuit board is a multi-layered printed circuit board including at least three signal layers.

20. The single in-line memory module as recited in claim 19 wherein the connector edge extends substantially along the entire length of the printed circuit board.

21. The single in-line memory module as recited in claim 19 wherein the first and second plurality of contact pads include contact pads dedicated for data comprising an error correction code.

22. A single in-line memory module for memory expansion in a computer system, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board;

a driver chip mounted at a substantially central position on one side of the printed circuit board, wherein the driver chip is connected to distribute at least one control signal to the plurality of memory chips; and a data path at least 64 bits in width provided between the connector edge of the printed circuit board and the plurality of memory chips;

wherein the printed circuit board is a multi-layered printed circuit board including at least three signal layers.

23. The single in-line memory module as recited in claim 22 wherein the data path is at least 128 bits wide.

24. A single in-line memory module for memory expansion in a computer system, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board, wherein some of the plurality of memory chips are mounted on the first side of the printed circuit board and others of the plurality of memory chips are mounted on the second side of the printed circuit board; and a data path at least 64 bits in width provided between the connector edge of the printed circuit board and the plurality of memory chips;

wherein the printed circuit board is a multi-layered printed circuit board including at least three signal layers.

25. The single in-line memory module as recited in claim 24 wherein the first and second plurality of contact pads include a total of at least 200 contact pads available for providing electrical connection to the socket.

26. The single in-line memory module as recited in claim 24 wherein the connector edge extends substantially along the entire length of the printed circuit board.

27. A single in-line memory module for memory expansion in a computer system, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board, wherein some of the plurality of memory chips are mounted on the first side of the printed circuit board and others of the plurality of memory chips are mounted on the second side of the printed circuit board;

a driver chip mounted at a substantially central position on one side of the printed circuit board, wherein the driver chip is connected to distribute at least one control signal to the plurality of memory chips; and a data path at least 64 bits in width provided between the connector edge of the printed circuit board and the plurality of memory chips;

wherein the printed circuit board is a multi-layered printed circuit board including at least three signal layers.

28. The single in-line memory module as recited in claim 27 wherein the data path is at least 128 bits wide.

29. The single in-line memory module as recited in claim 27 wherein the first and second plurality of contact pads are disposed substantially along the entire length of one edge of the printed circuit board.

30. The single in-line memory module as recited in claim 27 wherein the first and second plurality of contact pads include contact pads dedicated for data comprising an error correction code.

31. The single in-line memory module as recited in claim 27 wherein all signals necessary for operation of the single in-line memory module are provided through the connector edge.

32. A single in-line memory module for memory expansion in a computer system, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board;

a driver chip mounted on the first side of the printed circuit board substantially midway between one edge of the printed circuit board and an opposite edge of the printed circuit board, wherein the driver chip is connected to distribute at least one control signal to the plurality of memory chips; and a full-width data path at least 64 bits in width provided between the connector edge of the printed circuit board and the plurality of memory chips;

wherein the printed circuit board is a multi-layered printed circuit board including at least three signal layers.

33. A single in-line memory module for memory expansion in a computer system, the computer system including a CPU coupled to a processor bus having a total of n data lines, where n is at least 64, the single in-line memory module comprising:

a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;

a plurality of memory chips surface-mounted on the printed circuit board;

a driver chip mounted on the printed circuit board, wherein the driver chip is connected to distribute at least one control signal to the plurality of memory chips; and a data path provided between the connector edge of the printed circuit board and the plurality of memory chips, wherein the data path is at least n bits wide;

wherein the printed circuit board is a multi-layered printed circuit board including at least three signal layers.

34. The single in-line memory module as recited in claim 33 wherein the first and second plurality of contact pads include a total of at least 200 contact pads available for providing electrical connection to the socket.

35. The single in-line memory module as recited in claim 33 wherein the connector edge extends substantially along the entire length of the printed circuit board.

36. The single in-line memory module as recited in claim 33 wherein the first and second plurality of contact pads include contact pads dedicated for data comprising an error correction code.

37. The single in-line memory module as recited in claim 33 wherein the connector edge includes first and second contact regions arranged along a particular edge of the printed circuit board, wherein the particular edge includes an indentation between the first and second contact regions.

38. The single in-line memory module as recited in claim 33 wherein all signals necessary for operation of the single in-line memory module are provided through the connector edge.

39. The single in-line memory module as recited in claim 33 wherein the contact pads of the first plurality of contact pads are spaced with a center-to-center spacing of approximately 0.050 inch.

40. A single in-line memory module for memory expansion in a computer system, the computer system including a CPU coupled to a processor bus having a total of n data lines, where n is at least 64, the single in-line memory module comprising:
- a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;
- a plurality of memory chips surface-mounted on the printed circuit board; and
- a data path provided between the connector edge of the printed circuit board and the plurality of memory chips, wherein the data path is at least n bits wide;
- wherein the printed circuit board is a multi-layered printed circuit board including at least three signal layers.

41. The single in-line memory module as recited in claim 40 wherein the data path is at least 128 bits wide.

42. The single in-line memory module as recited in claim 40 wherein the first and second plurality of contact pads are disposed substantially along the entire length of one edge of the printed circuit board.

43. The single in-line memory module as recited in claim 40 wherein the first and second plurality of contact pads include contact pads dedicated for data comprising an error correction code.

44. The single in-line memory module as recited in claim 40 wherein all signals necessary for operation of the single in-line memory module are provided through the connector edge.

45. A single in-line memory module for memory expansion in a computer system, the computer system including a CPU coupled to a processor bus having a total of n data lines, where n is at least 64, the single in-line memory module comprising:
- a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board, wherein at least some of the first plurality of contact pads on the first side of the printed circuit board are configured to carry signals that are different from additional signals to be carried by corresponding pads of the second plurality of contact pads that are positioned opposite the first plurality of contact pads;
- a plurality of memory chips surface-mounted on the printed circuit board;
- a driver chip mounted on the printed circuit board between a first set of the plurality of memory chips and a second set of the plurality of memory chips, wherein the driver chip is connected to distribute at least one control signal to the plurality of memory chips; and
- a data path provided between the connector edge of the printed circuit board and the plurality of memory chips, wherein the data path is at least n bits wide;
- wherein the printed circuit board is a multi-layered printed circuit board including at least three signal layers.

46. The single in-line memory module as recited in claim 45 wherein the first and second plurality of contact pads are disposed substantially along the entire length of one edge of the printed circuit board.

47. A single in-line memory module for memory expansion in a computer system, the single in-line memory module comprising:
- a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board; and
- a plurality of surface-mount memory chips mounted on the printed circuit board;
- wherein a full-width data path at least 64 bits in width is provided between the connector edge of the printed circuit board and the plurality of surface-mount memory chips; and
- wherein at least some of the first plurality of contact pads on the first side of the printed circuit board are dedicated to electrical functions which are different from respective electrical functions of corresponding contact pads on the second side of the printed circuit board; and
- wherein the printed circuit board is a multi-layered printed circuit board including at least three signal layers.

48. A single in-line memory module for memory expansion in a computer system, the single in-line memory module comprising:
- a printed circuit board having a first side and a second side, wherein the printed circuit board includes a connector edge adapted for insertion within a socket of the computer system, the connector edge having a first plurality of contact pads on the first side of the printed circuit board and a second plurality of contact pads on the second side of the printed circuit board;
- a plurality of surface-mount memory chips mounted on the printed circuit board;
- a driver chip mounted on the printed circuit board and connected to distribute address signals to the plurality of surface-mount memory chips; and a data path at least 64 bits in width provided between the connector edge of the printed circuit board and the plurality of memory chips;

wherein at least some of the first plurality of contact pads on the first side of the printed circuit board are dedicated to electrical functions which are different from respective electrical functions of corresponding contact pads on the second side of the printed circuit board; and wherein the printed circuit board is a multi-layered printed circuit board including at least three signal layers.

49. The single in-line memory module as recited in claim 48 wherein the data path is at least 128 bits wide.

50. The single in-line memory module as recited in claim 48 wherein the connector edge extends substantially along the entire length of the printed circuit board.

51. The single in-line memory module as recited in claim 48 wherein the first and second plurality of contact pads include contact pads dedicated for data comprising an error correction code.

* * * * *